US008222591B2

United States Patent
Lin

(10) Patent No.: US 8,222,591 B2
(45) Date of Patent: Jul. 17, 2012

(54) PROXIMITY SENSORS WITH IMPROVED AMBIENT LIGHT REJECTION

(75) Inventor: Xijian Lin, Fremont, CA (US)

(73) Assignee: Intersil Americas Inc., Milpitas, CA (US)

( * ) Notice: Subject to any disclaimer, the term of this patent is extended or adjusted under 35 U.S.C. 154(b) by 280 days.

(21) Appl. No.: 12/716,220

(22) Filed: Mar. 2, 2010

(65) Prior Publication Data

US 2011/0006188 A1    Jan. 13, 2011

Related U.S. Application Data

(60) Provisional application No. 61/223,597, filed on Jul. 7, 2009.

(51) Int. Cl.
   *G01J 1/20* (2006.01)
   *H03M 1/00* (2006.01)
(52) U.S. Cl. ............ 250/214 DC; 250/214 R; 250/551; 341/110
(58) Field of Classification Search ............... 250/551, 250/214 R, 214 C, 214 DC, 214 A; 341/110, 341/155, 166; 345/175
   See application file for complete search history.

(56) References Cited

U.S. PATENT DOCUMENTS

| | | | |
|---|---|---|---|
| 5,991,040 A | 11/1999 | Doemens et al. | |
| 6,392,755 B1 | 5/2002 | Levecq et al. | |
| 6,956,518 B1 | 10/2005 | Piasecki et al. | |
| 2008/0135735 A1* | 6/2008 | Gottesman et al. | ....... 250/214 A |
| 2009/0224952 A1 | 9/2009 | Funabashi | |
| 2009/0244014 A1 | 10/2009 | Hotelling et al. | |
| 2010/0245289 A1* | 9/2010 | Svajda | ............ 345/175 |

FOREIGN PATENT DOCUMENTS

JP    2007071564    3/2007

OTHER PUBLICATIONS

"Infrared beam barrier/proximity sensor," http://www.uashem.com/pageid-57.html, © UaShem.com (Source: www.electronic-circuits-diagrams.com, published Feb. 1, 2005).
"Proximity Sensor," http://en.wikipedia.org/wiki/Proximity_sensor (accessed Apr. 16, 2008).
"Infrared IP Proximity Detector/IR Beam Barrier Circuit Diagram," http://www.electronics-circuits-diagrams.com/alarmsimages/alarmsckt19.shtml, © www.electronic-circuits-diagrams.com 2006.

* cited by examiner

*Primary Examiner* — Kevin Pyo
(74) *Attorney, Agent, or Firm* — Fliesler Meyer LLP

(57) ABSTRACT

In accordance with an embodiment, a proximity sensor includes a driver, a photodiode (PD), an analog-to-digital converter (ADC) with analog-to-digital-to-analog (ADA) feedback, and a controller. The driver is adapted to selectively drive a light source. The photodiode (PD) is adapted to produce a photodiode current signal (Idiode) indicative of an intensity of light detected by the PD, where the light detected by the PD can include ambient light and/or light transmitted by the light source that was reflected off an object proximate the PD. The controller is adapted to control the driver and the ADC with ADA feedback. A digital output of the ADC with ADA feedback is indicative of a proximity of an object to the PD with at least a majority of the ambient light detected by the PD rejected.

25 Claims, 9 Drawing Sheets

PROXIMITY SENSORS WITH IMPROVED AMBIENT LIGHT REJECTION

PRIORITY CLAIM

This application claims priority under 35 U.S.C. 119(e) to U.S. Provisional Patent Application No. 61/223,597 filed Jul. 7, 2009, entitled PROXIMITY SENSORS WITH IMPROVED AMBIENT LIGHT REJECTION, which is incorporated herein by reference.

CROSS-REFERENCE TO RELATED APPLICATION

This application is related to U.S. patent application Ser. No. 12/101,047, filed Apr. 10, 2008, entitled PROXIMITY SENSORS AND METHODS FOR SENSING PROXIMITY, which is incorporated herein by reference.

BACKGROUND

Infrared (IR) proximity sensors are becoming popular in cell-phone and handheld-device applications. For example, the sensor can be used to control a touch-screen interface for portable electronics devices. When an object, such as a person's finger, is approaching, the sensor detects the object. When the object is detected, a touch-screen interface or the like may perform an action such as enabling or disabling a display backlight, displaying a "virtual scroll wheel," navigation pad or virtual keypad, etc.

A conventional analog-output IR proximity sensor typically includes discrete components, including an infrared (IR) light emitting diode (LED), a switch to turn the IR LED on and off, and an IR photodiode (PD). During normal operation, the switch delivers current to the IR LED. The IR light emitted from the IR LED (or at least a portion of the IR light) will be reflected by an object when there is any, and be received by the PD. The PD converts the reflected light, as well as ambient light, to a current going to a resistor connected in parallel with the photodiode. The analog output is the voltage across the resistor. The intensity of the reflected IR light received by the photodiode is decreased at a rate of about $1/(4*X^2)$, where X is the distance between the object and the PD. However, as just mentioned, the total IR light received by the PD also includes ambient IR light, which may be from sun light, halogen light, incandescent light, fluorescent light, etc. FIG. 1A shows the spectrum of these different types of light.

In order to improve the signal-to-noise ratio of the sensor, the PD of the convention analog-output proximity sensor is typically made with a relatively large sensor area and with a special package, which has a narrow band-pass filter with the peak at the IR LED's emitting wavelength. A typical spectral response of such an IR PD is shown in FIG. 1B. Additionally, to improve the signal-to-noise ratio, a relatively high current is typically used to drive the IR LED in order to emit a stronger IR light signal. The use of the large size sensor area, the special package and the high current make such conventional IR proximity sensors unsuitable, or at least not optimal, for cell-phone and other handheld-device applications.

Since proximity sensors are meant to operate in a user environment that includes ambient light, such sensors should preferably be able to detect weak signals (for lower power operation and/or for longer distance detection) even in the presence of strong ambient light. However, the photo current generated by ambient light in such sensors often overwhelm the sensors. This results in sensors that are prone to falsely trigger, or not trigger when the should, due to strong ambient light interference.

Some conventional techniques for attempting to reject ambient light use a transimpedance amplifier, as described with reference to FIGS. 1C and 1D. In FIG. 1C, a high-pass resistance-capacitance (RC) network is provided at an input of a preamplifier 102, to pass the high frequency components of a signal while blocking the low frequency components. However, this solution has two major drawbacks. First, a very large resistor (R) and a very large capacitor (C) are required to achieve the low cutoff frequency, which is undesirable because such passive components occupy a very large chip area and are sensitive to parasitic-coupled noise. Second, the voltage across the resistor (R) varies with the average photo current, which causes the preamplifier's common-input (and therefore the overall performance) to be directly affected by the ambient light level. In the alternative configuration shown in FIG. 1D, the RC network is replaced by an active feedback loop around a transimpedance amplifier. In this configuration, the ambient light rejection is achieved by using analog level detection based on the peaks of the photo current signal. However, this technique assumes that the average current is constant, requires a reset mechanism and has a very low speed operation.

SUMMARY

In accordance with an embodiment, a proximity sensor includes a driver, a photodiode (PD), an analog-to-digital converter (ADC) with analog-to-digital-to-analog feedback, and a controller. The driver is adapted to selectively drive a light source. The photodiode (PD) is adapted to produce a photodiode current signal (Idiode) indicative of an intensity of light detected by the PD, where the light detected by the PD can include ambient light and/or light transmitted by the light source that was reflected off an object proximate the PD. The controller is adapted to control the driver and the ADC with ADA feedback. A digital output of the ADC with ADA feedback is indicative of a proximity of an object to the PD with at least a majority of the ambient light detected by the PD rejected.

In accordance with an embodiment, the ADC with ADA feedback includes an M-bit ADC, an M-bit digital-to-analog converter (DAC), and an N-bit ADC. The M-bit ADC is adapted to receive a first analog signal (indicative of an intensity of light detected by the PD during a first period of time (e.g., t1) when the light source is not driven to transmit light), and convert the first analog signal to M-bits of data (indicative of the intensity of light detected by the PD during the first period of time when the light source is not driven to transmit light). The M-bit DAC is adapted to receive the M-bits of data, produced by the M-bit ADC (which are indicative of the intensity of light detected by the PD during the first period of time when the light source is not driven to transmit light), and convert the M-bits of data to a second analog signal, e.g., Idac in FIGS. 4 and 5 (indicative of the intensity of the light detected by the PD during the first period of time when the light source is not driven to transmit light). The N-bit ADC is adapted to receive a third analog signal (indicative of an intensity of light detected by the PD during a further period of time, e.g., t2, t3 and t4) with the second analog signal produced by the M-bit DAC subtracted therefrom. The N-bit ADC is also configured to convert the third analog signal to N-bits of data, which is the digital output of the ADC with ADA feedback. In accordance with an embodiment, during a portion (e.g., t2) of the further period of time (e.g., t2, t3 and t4) the light source is driven to transmit light, and during another portion (e.g., t3 and t4) of the further period of time (e.g., t2, t3 and t4) the light source is not driven to transmit light. Additionally, in accordance with an embodiment, the portion (e.g., t2) of the further period of time (e.g., t2, t3 and t4) during which the light source is driven to transmit light is shorter than the another portion (e.g., t3 and t4) of the further period of time (e.g., t2, t3 and t4) during which the light source is not driven to transmit light.

In accordance with an embodiment, the N-bit ADC includes an up-down counter, that counts up during part (e.g., t2 and t3) of the further period of time (e.g., t2, t3 and t4) at least a portion of which (e.g., t2) the light source is driven to transmit light, and counts down during a remainder (e.g., t4) of the further period of time (e.g., t2, t3 and t4), to thereby produce a count value. In accordance with this embodiment, the count value at the end of the further period of time (e.g., t2, t3 and t4) is the N-bits of data indicative of a proximity of an object to the PD with at least a majority of ambient light detected by the PD rejected.

In accordance with an embodiment, M<N. In accordance with another embodiment, M=N. In still a further embodiment, M>N.

Embodiments of the present invention are also directed to systems that include a proximity sensor, such as the one summarized above. Such a system can also include a subsystem capable of being enabled and disabled, and a comparator or processor that receives digital output of the ADC with ADA feedback and enables or disables the subsystem based on the digital output of the ADC with ADA feedback. Such a subsystem can be, e.g., a touch-screen, a display, a backlight, a virtual scroll wheel, a virtual keypad, or a navigation pad, but is not limited thereto.

Embodiments of the present invention are also directed to methods that can be used to detect proximity of an object relative to a PD, or more generally, methods for use with a light source and a photodiode (PD). Such a method can include selectively driving the light source. Such a method can also include producing a first analog signal (indicative of an intensity of light detected by the PD during a first period of time when the light source is not driven to transmit light), and converting the first analog signal to M-bits of data (indicative of the intensity of light detected by the PD during the first period of time when the light source is not driven to transmit light). The method can also include converting the M-bits of data to a second analog signal (indicative of the intensity of the light detected by the PD during the first period of time when the light source is not driven to transmit light). The method can further include producing a third analog signal (indicative of an intensity of light detected by the PD during a further period of time, e.g., t2, t3 and t4, with the second analog signal produced by the M-bit DAC subtracted therefrom). Further, the method can include converting the third analog signal to N-bits of data indicative of a proximity of an object to the PD with at least a majority of ambient light detected by the PD rejected. In accordance with an embodiment, during a portion, (e.g., t2) of the further period of time (e.g., t2, t3 and t4) the light source is driven to transmit light, and during another portion (e.g., t3 and t4) of the further period of time the light source is not driven to transmit light. The method can also include enabling or disabling a subsystem based on the N-bits of data.

Further and alternative embodiments, and the features, aspects, and advantages of the embodiments of invention will become more apparent from the detailed description set forth below, the drawings and the claims.

DETAILED DESCRIPTION

Figure 2:
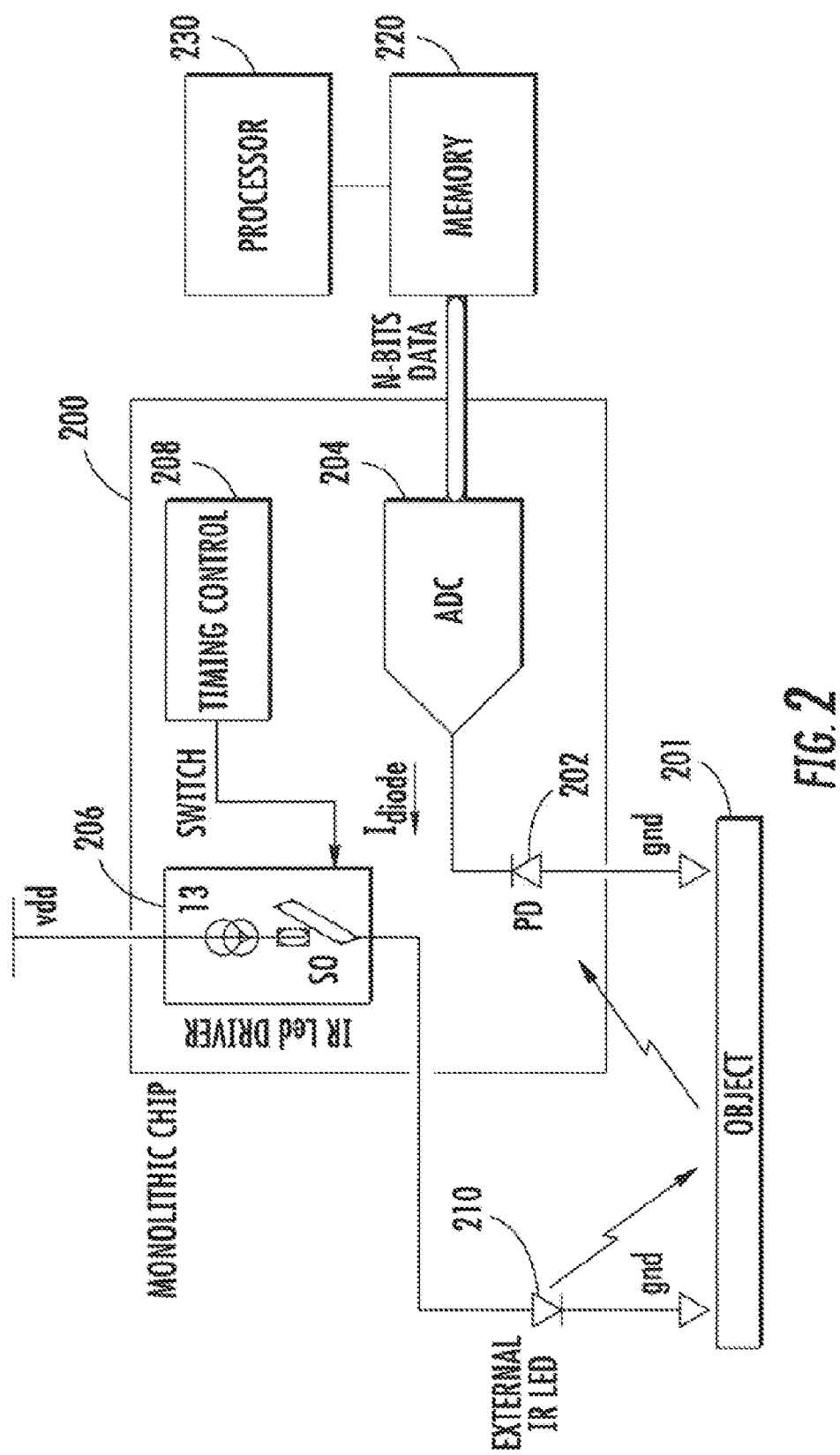
FIG. 2 shows a monolithic low-cost and low-power IR proximity sensor, according to an embodiment of the present invention.

FIG. 2 shows a monolithic low-cost and low-power proximity sensor 200, according to an embodiment of the present invention, which includes a monolithic chip including a CMOS-integrated photodiode 202, an analog-to-digital converter (ADC) 204, an IR LED driver 206 and a timing controller 208. The IR LED driver 206, which is controlled by the timing controller 208, selectively drives an external IR LED 210. The timing control 208 can provide a clock signal to the ADC 204. Where the ADC 204 includes an up/down counter, the timing control 208 can also provide a binary up/down control signal, which specifies when the counter should count up, and when the counter should be count down. Additionally, the timing control 208 can provide other timing control signals to components of the ADC 204, as will be appreciated from the discussion of FIGS. 4 and 5 below. A benefit of the sensor 200 is that it can provide direct conversion of the photodiode current (Idiode) to a digital output, thereby enabling relatively small current signals to be processed with low-offset and high resolution, as will be appreciated from the discussion below.

Figure 3:
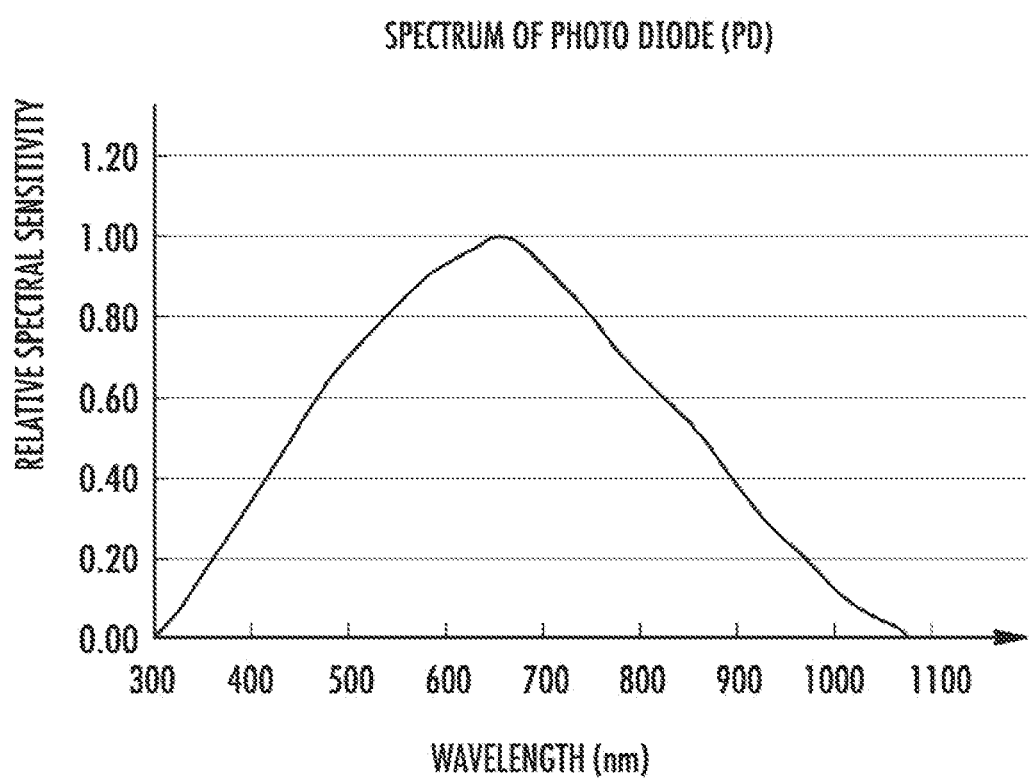
FIG. 3 shows an exemplary spectral response of a photodiode (PD), without any spectrum filter, that can be used in the proximity sensor of FIG. 2.

In accordance with an embodiment, the photodiode (PD) 202 is a regular PN junction diode without any spectrum filter, with an exemplary spectral response shown in FIG. 3.

Preferably, the IR LED 210 and the PD 202 are arranged, relative to one another, such that no IR light can travel directly from the IR LED 210 to the PD 202, but rather, the PD 202 should preferably only detect light from the IR LED 210 that has been reflected off an object 201 in proximity to the sensor 200. As the term is used herein, ambient light refers to background light, i.e., light already existing in an indoor or outdoor setting that is not caused by light produced by the IR LED 210. Such ambient light includes radiation over a wide range of wavelengths, including IR wavelengths.

Still referring to FIG. 2, when the IR LED driver 206 is off (i.e., switch S0 in FIG. 2 is open), and thus the external IR LED 210 is off (i.e., not producing any IR light), the input to the ADC 204 is indicative of (e.g., proportional to) the intensity of ambient light. When the IR LED driver 206 is on (i.e., switch S0 is closed), and thus the external IR LED 210 is on (i.e., producing IR light), the input to the ADC 204 is indicative of (e.g., proportional to) the intensity of both the ambient light and received IR light from the IR LED 210 that has been reflected toward and detected by the PD 202. When an object is not in proximity to the sensor 200, substantially no IR light produced by the IR LED 210 should be reflected back toward the PD, and thus, during this condition, the input to the ADC 204 will again be indicative of (e.g., proportional to) the intensity of the ambient light.

Figure 4:
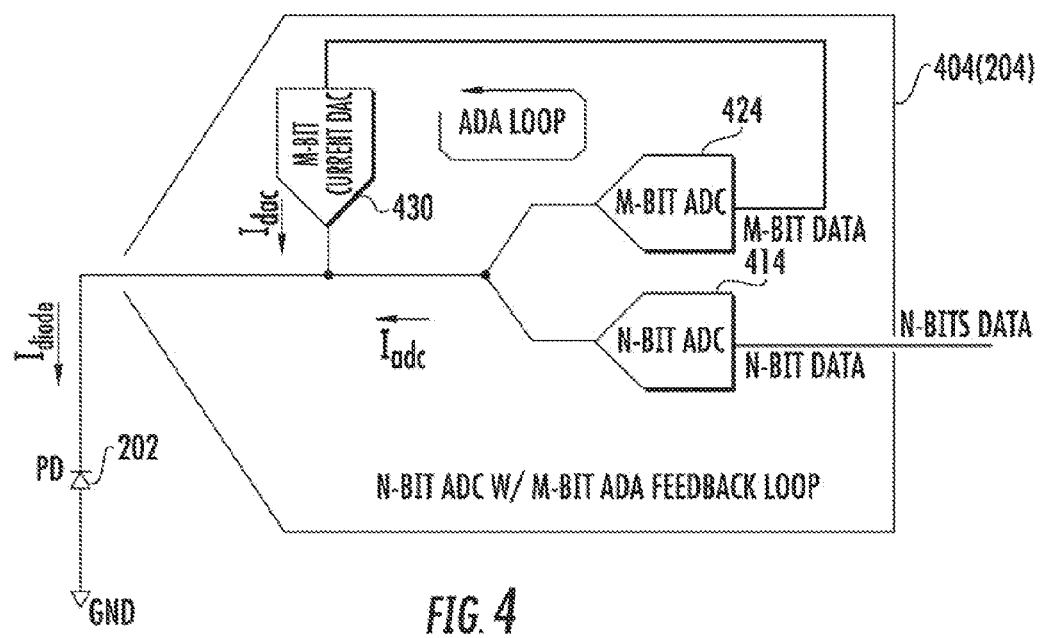
FIG. 4 shows an analog-to-digital converter (ADC) with analog-to-digital-to-analog (ADA) feedback, that can be used in the proximity sensor of FIG. 2, to improve the ambient light rejection, in accordance with an embodiment of the present invention.

FIG. 4 shows an ADC 404 with feedback according to an embodiment of the present invention, which can be used to implement the ADC 204 shown in FIG. 2. The ADC 404 includes an N-bit forward path including an N-bit ADC 414. The ADC 404 also includes a M-bit feedback loop used to reject ambient light via direct photodiode current processing. The feedback loop includes a M-bit ADC 424 and a M-bit digital-to-analog converter (DAC) 430. The feedback loop may also be referred to as an ADA feedback loop, because it includes an analog-to-digital-to-analog (ADA) conversion. Thus, the ADC 404 can be referred to as an ADC with ADA feedback. The output of the N-bit ADC 414 of the forward path provides the N-bit output of the ADC 404, which can be the N-bit output of ADC 204 in FIG. 2. In accordance with an embodiment of the present invention M<N (e.g., M=7 and N=8). However, it is also within the scope of the present invention that M=N, or that M>N. As will be appreciated from the description herein, the N-bit ADC with the M-bit ADA feedback loop is used to reject ambient light and increase the dynamic range and sensitivity of proximity sensing. Some of the advantages of using the ADA feedback loop, over using an analog feedback loop, includes higher speed/faster operation, smaller silicon size, and lower noise.

Figure 6:
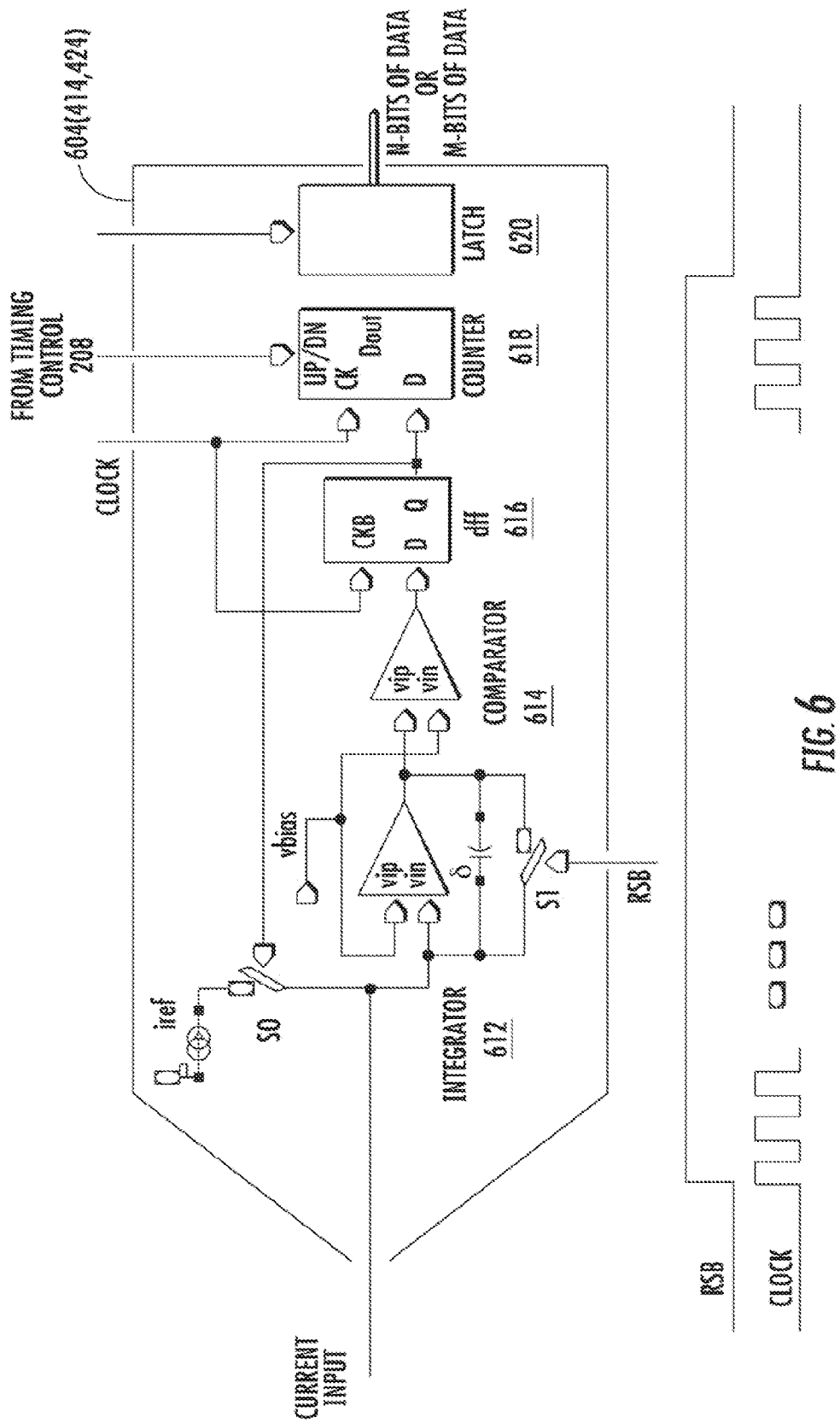
FIG. 6 shows how the N-bit and M-bit ADCs, within the ADC with ADA feedback of FIG. 4, can be implemented, along with a corresponding possible timing diagram.

In accordance with an embodiment, the M-bit ADC 424 and the M-bit DAC 430 have a same full-scale reference current to reduce and preferably remove effects of gain errors in the M-bit ADC 424 and the M-bit DAC 430. The M-bit ADC 424 can be implemented using a charge balanced ADC, an example of which is shown in FIG. 6, but is not limited thereto. The M-bit DAC 430 can be implemented, e.g., using M-bit binary weighted current sources, in order to save circuit size, but is not limited thereto. The N-bit ADC 414 can also be implemented using a charge balanced ADC, an example of which is shown in FIG. 6, but with a different full-scale reference current than the M-bit ADC 424, but is not limited thereto. For the following discussion, it will be assumed that each ADC includes a counter (e.g., up/down counter 618 in FIG. 6), with the output of the counter being the output of the ADC. This can be better understood from the discussion of FIG. 6, later below.

Figure 5:
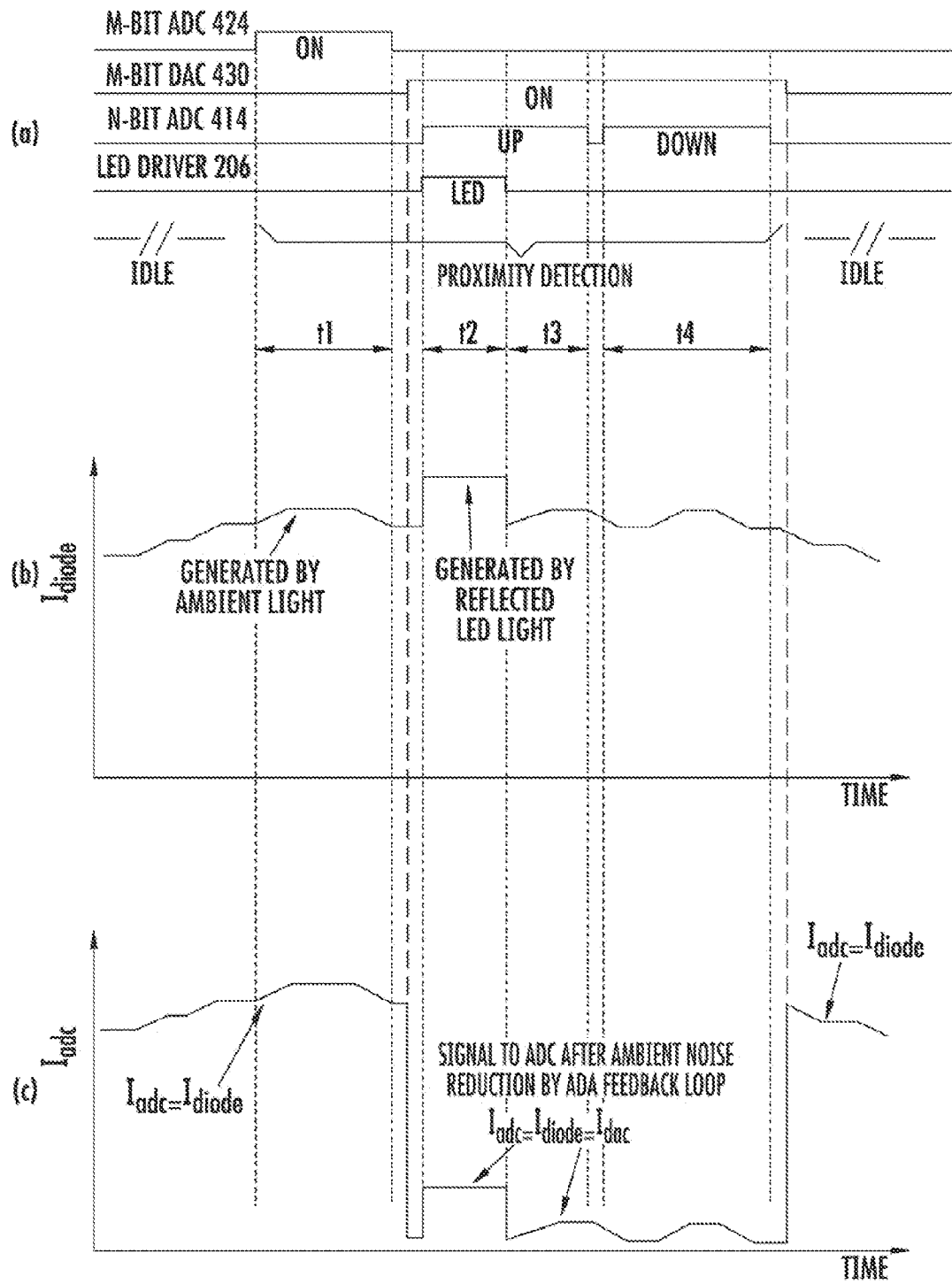
FIG. 5 shows a timing diagram used to explain operation of the proximity sensor of FIG. 2, implementing using the ADC with ADA feedback of FIG. 4, in accordance with an embodiment of the present invention.

FIGS. 5(a), (b) and (c), which can collectively be referred to as FIG. 5, show a timing diagram of signal processing for a proximity detection according to an embodiment of the present invention. Reference is also made to components within FIGS. 2 and 4 when explaining the timing diagram of FIGS. 5(a), (b) and (c).

FIG. 5(a) illustrates the timing of the M-bit ADC 424, the M-bit DAC 420 and the N-bit ADC 414 of the N-bit ADC with the M-bit ADA feedback loop 404 (which can be used to implement that ADC 204), as well as the timing of the laser driver 206. FIG. 5(b) illustrates the timing of a photodiode current Idiode produced by the PD 202. FIG. 5(c) illustrates the timing of a current Iadc that is converted to N-bits by the N-bit ADC 414 and converted to M-bits by the M-bit ADC. As can be appreciated from FIG. 4 and FIGS. 5(a), (b) and (c), when the M-bit DAC 430 is off the Iadc=Idiode, and when the M-bit DAC 430 is on the Iadc=Idiode−Idac.

During a time period t1 (when the M-bit ADC 424 is on, the M-bit DAC 430 is off, the N-bit ADC 414 is off, and the LED Driver 206 is not driving the LED 210), the PD 202 produces a photodiode current Idiode in response to ambient light, and the M-bit ADC 424 converts Idiode into an M-bit code. This results in the current Iadc (in FIG. 4) being substantially the same as Idiode during the time period t1, as can be appreciated from FIGS. 5(a), (b) and (c). While the M-bit ADC 424 is on it converts the analog photocurrent received at its input into digital data, which are latched at the end of the conversion time (e.g., by latch 620 in FIG. 6), and provided at the output of the M-bit ADC 424 (even after the M-bit ADC 424 is changed from on to off). At the same time the M-bit ADC 424 is on and performing its conversion: the M-bit DAC 430 is off and its output is zero; and the N-bit ADC 414 is off, not performing a conversion and its output is zero.

During time periods t2, t3 and t4 (during which the M-bit ADC 424 is off, and the M-bit DAC 430 is on), the M-bit DAC 430 receives at its digital input the M-bit code output by the M-bit ADC 424 at the end of the time period t1, and based on that M-bit code, the M-bit DAC 430 outputs an analog current Idac that is indicative of the ambient light detected during the time period t1.

During the time period t2, the LED Driver 206 is driving the LED 210, which causes Idiode to be indicative of both ambient light detected by the PD 202 and IR light from the IR LED 210 reflected off an object 201 and detected by the PD 202. Also, during the time period t2, the N-bit ADC 414 is on and counting up.

During the time period t3, even though the LED Driver 206 is no longer driving the LED 210, the N-bit ADC 414 is still on and still counting up. The benefits of this are explained below.

During the time period t4 (which is preferably as long as the time period t2 plus the time period t3), the LED Driver 206 is not driving the LED 210, which causes Idiode to be only indicative ambient light detected by the PD 202. Also, during the time period t4, the N-bit ADC 414 is on and counting down.

As can be seen in FIG. 5(c), during the time periods t2, t3 and t4, Iadc=Idiode−Idac. This enables the N-bit ADC 414 to process the signal Iadc=Idiode−Idac during two time slots during which the M-bit DAC 430 is on. During one time slot, the N-bit ADC 414 counts (converts) up while LED 210 is on at least a portion of the time slot; and during another time slot, the N-bit ADC 414 counts (converts) down while LED 210 is off. In accordance with an embodiment, the LED is turned on (e.g., driven by the driver 206) for only a portion of the time (e.g., half the time) that the N-bit ADC is counting up, to compensate for potential delays of the LED driver timing, to thereby ensure that the PD 202 only detects LED light reflected off an object while the N-bit ADC 414 is counting up. Stated another way, in accordance with an embodiment, the N-bit ADC 414 counts up for an amount of time (i.e., for both time periods t2 and t3) that is longer than an amount of time that the LED 210 is turned on (i.e., only time period t3), to make sure that the N-bit ADC 414 is counting up the entire time that the photo detector 202 detects LED light reflected off an object 201.

Figure 1A:
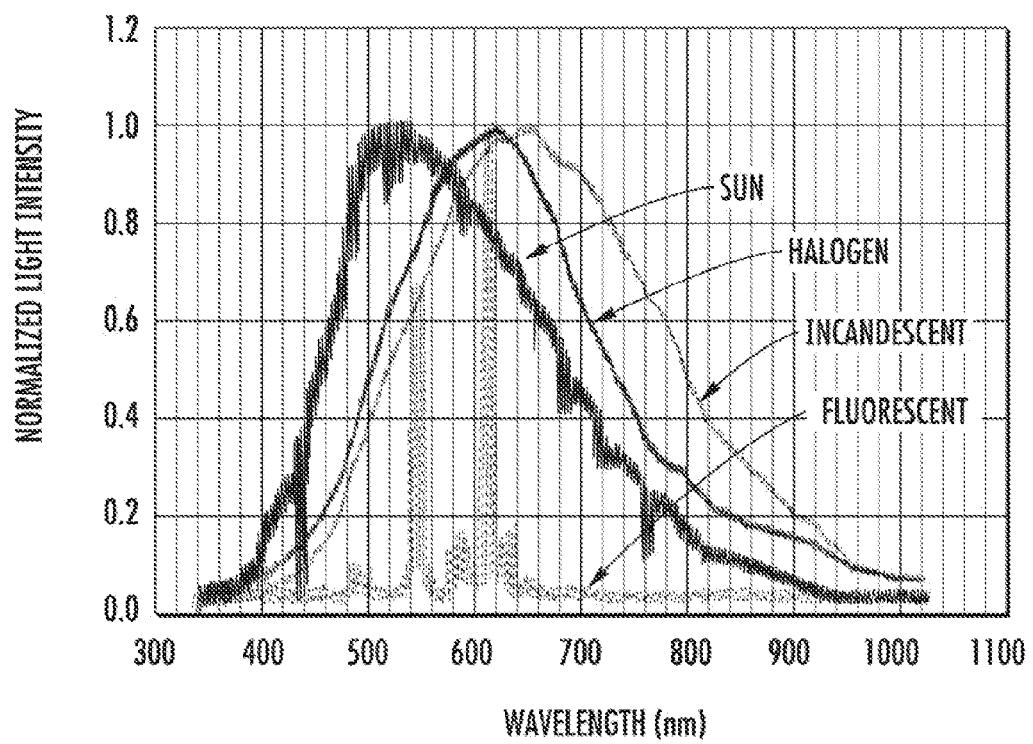
FIG. 1A shows the spectrum of different types of light.
Figure 1B:
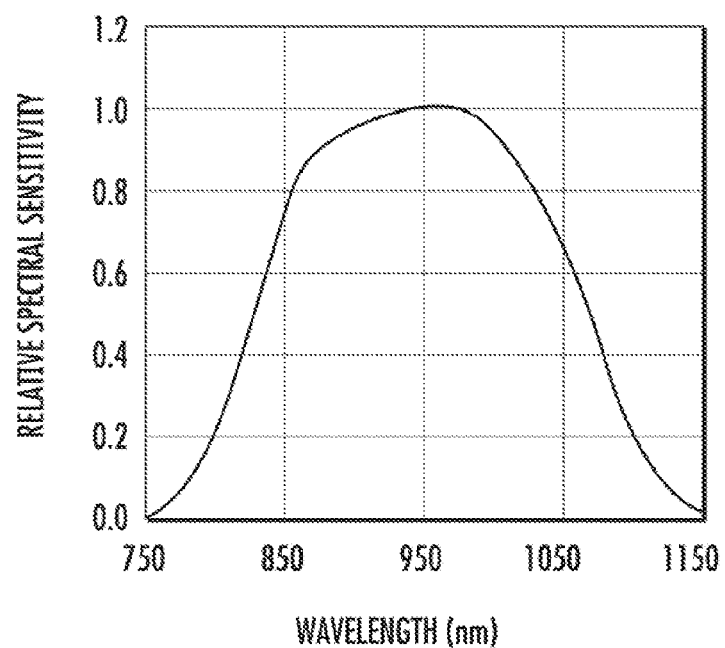
FIG. 1B shows an exemplary spectral response of an infrared (IR) photodiode.
Figure 1C:
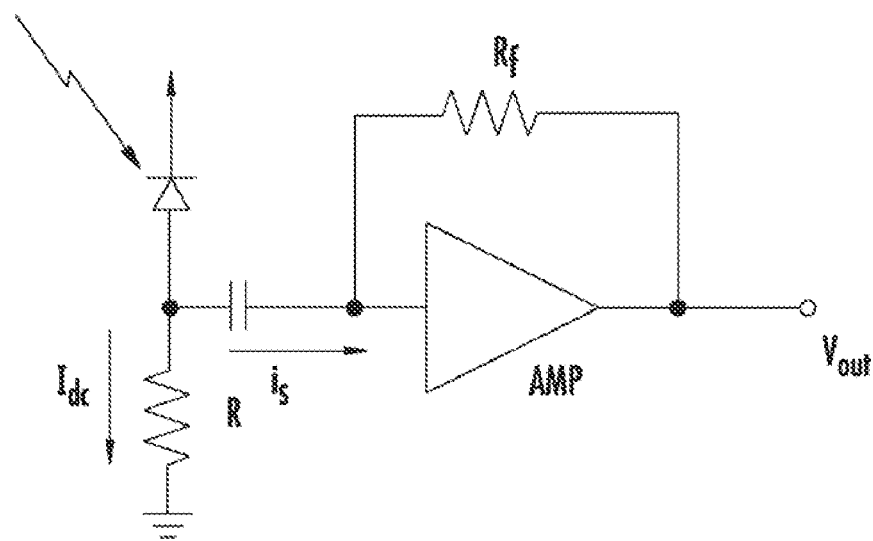
FIGS. 1C and 1D show some conventional circuits that have been used with a photo detector to attempt to reject ambient light.
Figure 1D:
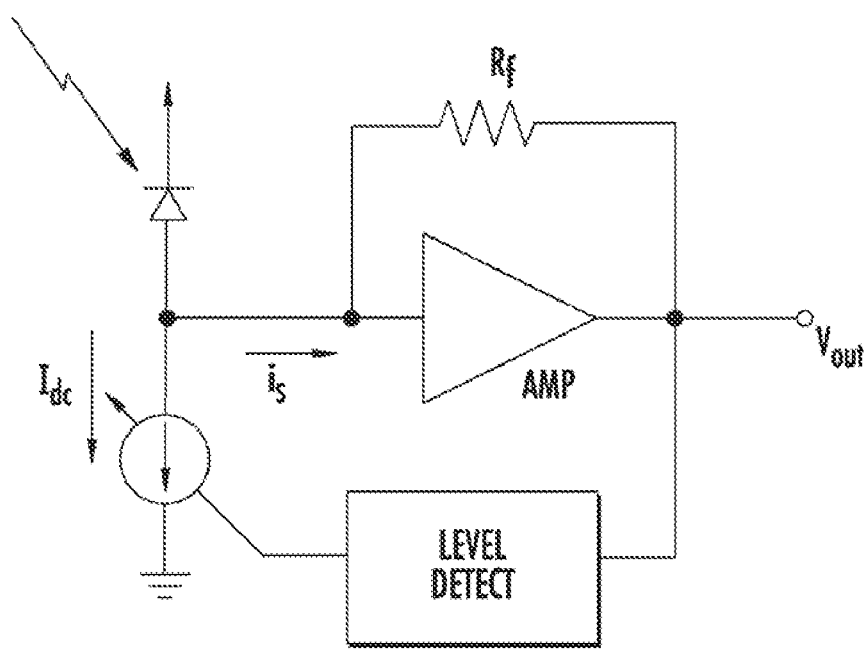

The N-bit ADC 414 outputs N-bits of data after the completion of the counting up and down, which is indicative of (e.g., directly proportional to) the photodiode current Idiode component resulting from the LED light reflected off an object, and is independent of the difference between the photodiode current generated by ambient light and the output current from the M-bit DAC 424, i.e., the residue from the ADA feedback loop. The proximity detection speed, including the completion of ADA feedback loop and the up/down counting of the N-bit ADC 414, is much faster than the proximity detection speed possible when using traditional transimpedance amplifier techniques to reject ambient light. Examples of such traditional transimpedance amplifier techniques were discussed above with reference to FIGS. 1C and 1D.

In summary, the ADA feedback loop greatly increases the signal dynamic range of proximity sensing. The counting up and down scheme of the N-bit ADC 414, with specific LED timing, greatly increases the sensitivity of proximity sensing by reducing the effect of the residue from the ADA feedback loop.

FIG. 6 shows how the N-bit ADC 414 and the M-bit ADC 424, within the ADC with ADA feedback 404 of FIG. 4, can be implemented as charge balancing ADCs, along with a corresponding exemplary timing diagram. As shown in FIG. 6, each ADC can include an integrator 612, a comparator 614, a D flip-flop (dff) 616, a counter 618, and a latch 620. For the N-bit ADC 414, the counter 618 should preferably be an up/down counter, so that the counter can be used to perform a subtraction function. For the M-bit ADC 424, the counter need only count in one direction, e.g., up.

For each analog-to-digital conversion with N bits, performed by the N-bit ADC 414, $2^N$ clock periods are needed. During each conversion time, the number of 1s from the dff 616 are counted, and a charge of Tclock*Iref is delivered to the integrator 612 for each corresponding 1. Here, Tclock is the clock period and Irefn is the reference current associated with the N-bit ADC 414. According to charge conservation:

$$Iadc*Tclock*2^N = Irefn*Tclock*DataN \quad \text{(Equation 1A)}.$$

Here, Iadc is the current at the input of the ADC, and DataN is the counter's output at the end of an analog-to-digital conversion time, as latched by the latch 620. The left side of the equation represents the total charge removed from the integrator by the input current, and the right side represents the total charge delivered to the integrator by the reference current. From Equation 1A, the digital output (DataN) of the N-bit ADC 414 can be expressed as:

$$DataN = (Iadc1/Irefn)*2^N - (Iadc2/Irefn)*2^N \quad \text{(Equation 1B)}$$
$$= [(Iadc1 - Iadc2)/Irefn]*2^N.$$

In Equation 1B, Iadc1 is the average current at the input of the N-bit ADC 414 while the N-bit ADC 414 is on and counting up, and Iadc2 is the average current at the input of the N-bit ADC 414 while the N-bit ADC 414 is on and counting down.

Similarly, for each data (i.e., analog to digital) conversion with M bits, performed by the M-bit ADC 424, $2^M$ *clock periods are needed. During each conversion time, the number of* 1s from the dff 616 are counted, and a charge of Tclock*Irefm is delivered to the integrator 612 for each corresponding 1. Here, Tclock is the clock period and Irefm is the reference current associated with the M-bit ADC 424. According to charge conservation:

$$Iadc*Tclock*2^M = Irefm*Tclock*DataM \quad \text{(Equation 1C)}.$$

From Equation 1C, the digital output (DataM) of the M-bit ADC 424 can be expressed as:

$$DataM = (Iadc/Irefm)*2^M \quad \text{(Equation 1D)}.$$

In Equation 1D, Iadc is the average current at the input of the M-bit ADC 424 while the M-bit ADC 424 is on and counting up.

In accordance with an embodiment of the present invention, various portions of N-bit ADC 414 and the M-bit ADC 424 can be shared, to reduce the size of the circuit, and thus a chip size. For example, the integrator 612, the comparator 614, and the dff 616, and the counter 618, or at least portions thereof, can be shared. Timing control circuits can also be shared.

Figure 7:
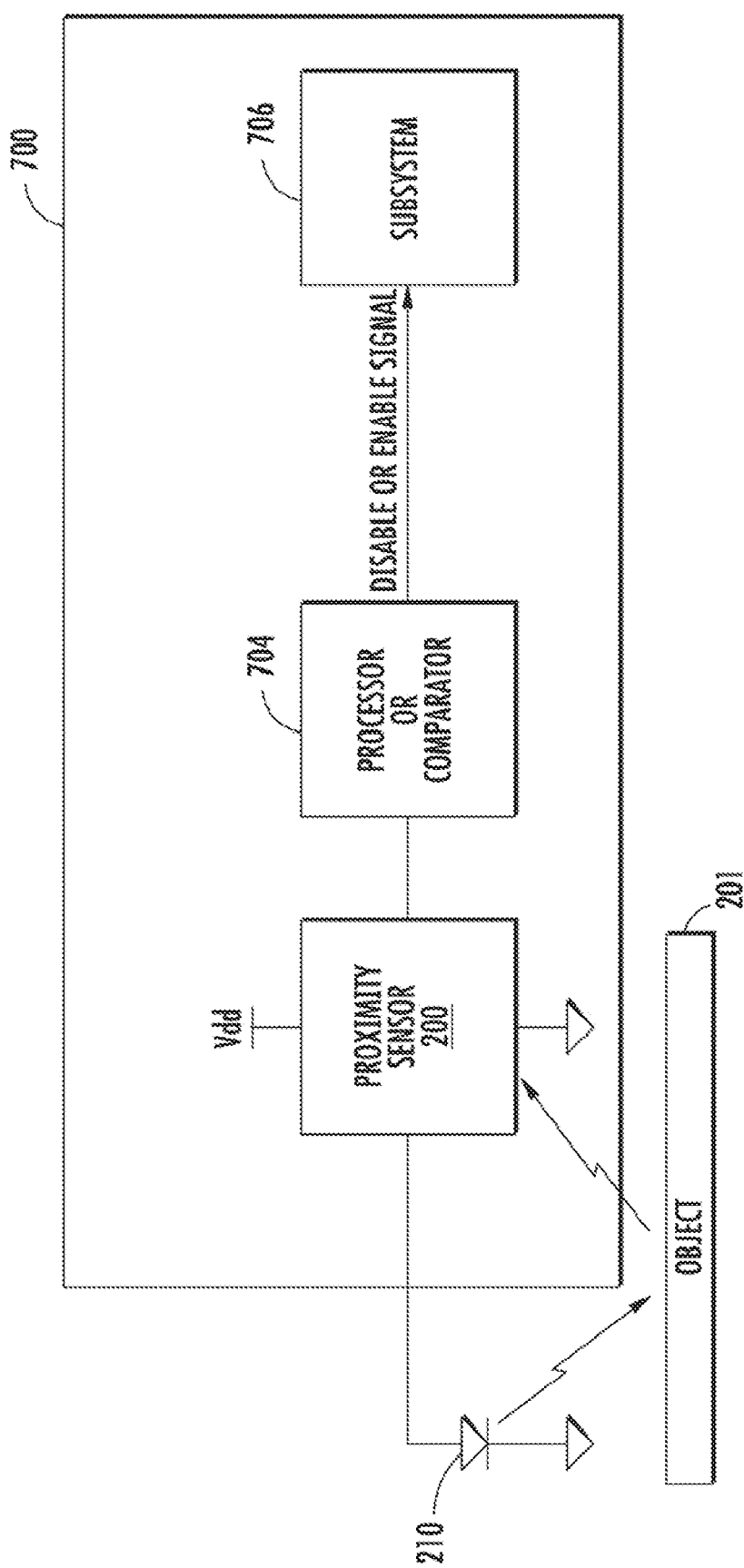
FIG. 7 is a high level block diagram of a system according to an embodiment of the present invention.

Proximity sensors of embodiments of the present invention can be used in various systems, including, but not limited to, cell-phones and handheld-devices. Referring to the system 700 of FIG. 7, for example, the proximity sensor 200 can be used to control whether a subsystem 706 (e.g., a touch-screen, display, backlight, virtual scroll wheel, virtual keypad, navigation pad, etc.) is enabled or disabled. For example, the proximity sensor can detect when an object, such as a person's finger, is approaching, and based on the detection either enable (or disable) a subsystem 706. More specifically, an output of the proximity sensor 200 can be provided to a comparator or processor 704 which can, e.g., compare the output of the proximity sensor to a threshold, to determine whether the object is within a range where the subsystem 706 should be enabled (or disabled, depending on what is desired). Multiple thresholds (e.g., stored digital values) can be used, and more than one possible response can occur based on the detected proximity of an object. For example, a first response can occur if an object is within a first proximity range, and a second response can occur if the object is within a second proximity range. Exemplary responses can include starting various system and/or subsystem operations.

It is within the scope of the present invention to use alternative light sources, i.e., besides an LED. For example, a laser diode can be used to produce light in place of an LED. Alternatively, an incandescent light can be used in place of an LED. These are just a few examples, which are not meant to be limiting. In the above described embodiments, the light source (e.g., LED 210) was described as producing IR light. In alternative embodiments, a controlled light source can produce alternative wavelengths of light, such as, but not limited to, light in the visible spectrum (e.g., blue, green or red light).

Embodiments of the present invention are also directed to the ADC with ADA feedback of FIG. 4, which is explained with reference to FIGS. 5(a)-(c).

Figure 8:
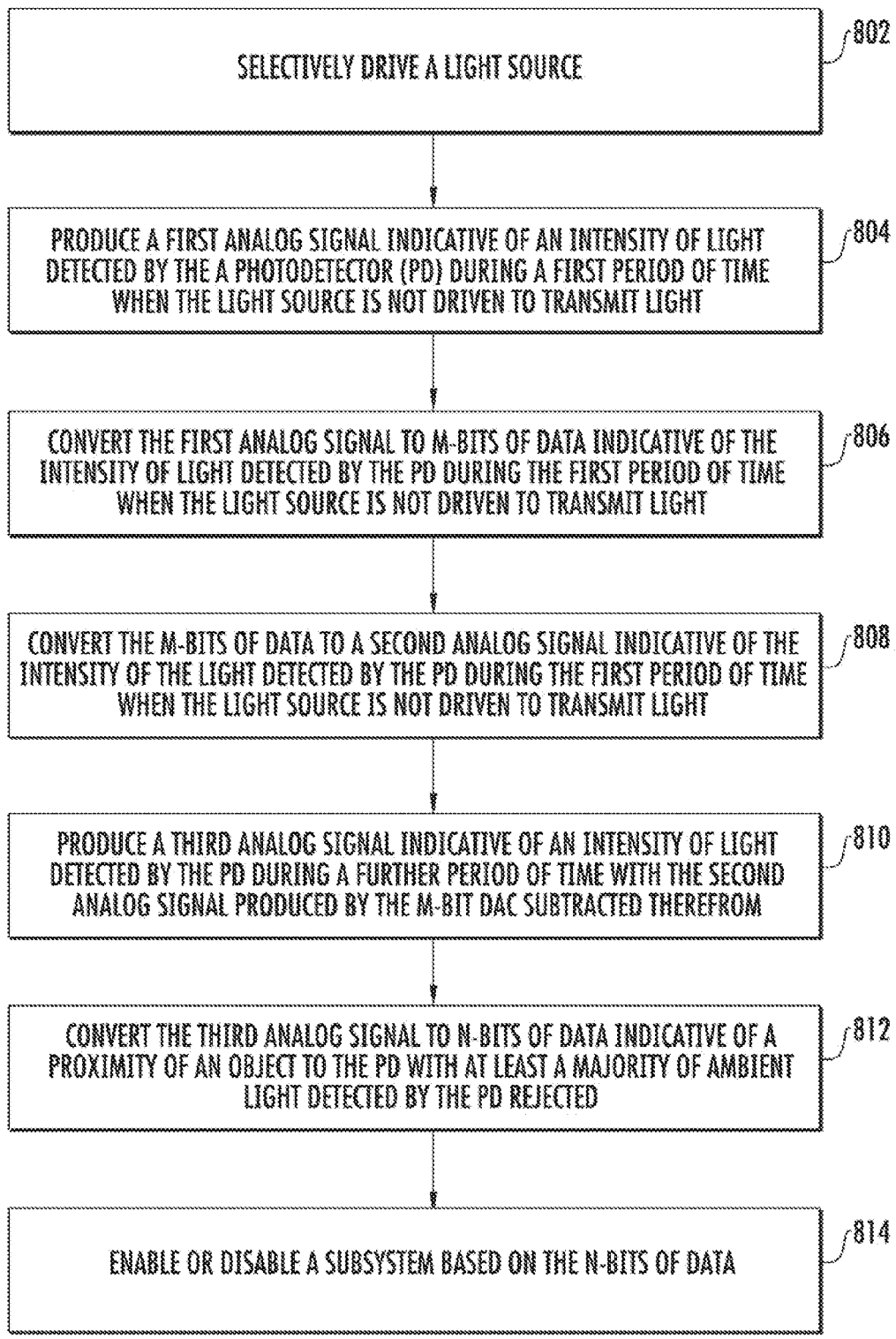
FIG. 8 is a high level flow diagram of a method according to an embodiment of the present invention.

FIG. 8 is a high level flow diagram of a method according to an embodiment of the present invention. Referring to FIG. 8, as indicated at step 802, a light source, e.g., 210 in FIG. 2, is selectively driven. As indicated at steps 804 and 806, a first analog signal (indicative of an intensity of light detected by the PD during a first period of time when the light source is not driven to transmit light) is produced and converted to M-bits of data (also indicative of the intensity of light detected by the PD during the first period of time when the light source is not driven to transmit light). As indicated at step 808, the M-bits of data are converted to a second analog signal, e.g., Idac in FIGS. 5 and 6 (again indicative of the intensity of the light detected by the PD during the first period of time when the light source is not driven to transmit light). In other words, at steps 804, 806 and 808 there is an analog-to-digital-to-analog conversion that is used to generate the analog signal Idac, which is substantially the same as Idiode during the time period t1, and used to increase the dynamic range and sensitivity of proximity sensing. As indicated at step 810, a third analog signal is produced, e.g., Iadc in FIGS. 5 and 6 (where the third analog signal is indicative of an intensity of light detected by the PD during a further period of time, e.g., t2, t3 and t4 in FIG. 5, with the second analog signal produced by the M-bit DAC subtracted therefrom, e.g., Iadc=Idiode−Idac). As indicated at step 812, the third analog signal is converted to N-bits of data (indicative of a proximity of an object to the PD with at least a majority of ambient light detected by the PD rejected). In accordance with an embodiment, during a portion, e.g., t2 in FIG. 5, of the further period of time, e.g., t2, t3 and t4 in FIG. 5, the light source is driven to transmit light, and during another portion, e.g., t3 and t4 in FIG. 5, of the further period of time, e.g., t2, t3 and t4 in FIG. 5, the light source is not driven to transmit light. The method can also include enabling or disabling a subsystem based on the N-bits of data, as indicated at step 814.

While very good ambient light rejection can be achieved using embodiments of the present invention, it is also possible that reflective and/or absorption optical filters can cover the PD 202, which will reduce the amount of infrared ambient light that ever reaches the PD.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A proximity sensor, comprising:
a driver adapted to selectively drive a light source;
a photodiode (PD) adapted to produce a photodiode current signal (Idiode) indicative of an intensity of light detected by the PD, where the light detected by the PD can include ambient light and/or light transmitted by the light source that was reflected off an object proximate the PD;
an analog-to-digital converter (ADC) with analog-to-digital-to-analog (ADA) feedback; and
a controller adapted to control the driver and the ADC with ADA feedback;
wherein a digital output of the ADC with ADA feedback is indicative of a proximity of an object to the PD with at least a majority of the ambient light detected by the PD rejected;
wherein the controller and the ADC with the ADA feedback are configured to
(a) during a first period of time when the light source is not driven to transmit light, produce M-bits of data indicative of an intensity of ambient light detected by the PD;
(b) during a further period of time, at least a portion of which the light source is driven to transmit light,
(b.1) convert the M-bits of data to a first analog signal indicative of the intensity of the ambient light detected by the PD during the first period of time
(b.2) receive a second analog signal indicative of an intensity of light detected by the PD during the further period of time;
(b.3) subtract the first analog signal from the second analog signal to produce a third analog signal indicative of a proximity of an object to the PD with at least a majority of the ambient light detected by the PD rejected; and
(b.4) convert the third analog signal to N-bits of data, which is the digital output of the ADC with ADA feedback.

2. A proximity sensor, comprising:
a driver adapted to selectively drive a light source;
a photodiode (PD) adapted to produce a photodiode current signal (Idiode) indicative of an intensity of light detected by the PD, where the light detected by the PD can include ambient light and/or light transmitted by the light source that was reflected off an object proximate the PD;
an analog-to-digital converter (ADC) with analog-to-digital-to-analog (ADA) feedback; and
a controller adapted to control the driver and the ADC with ADA feedback;
wherein a digital output of the ADC with ADA feedback is indicative of a proximity of an object to the PD with at least a majority of the ambient light detected by the PD rejected;
wherein the ADC with the ADA feedback comprises:
an M-bit ADC adapted to
receive a first analog signal indicative of an intensity of light detected by the PD during a first period of time when the light source is not driven to transmit light, and
convert the first analog signal to M-bits of data indicative of the intensity of light detected by the PD during the first period of time when the light source is not driven to transmit light;
an M-bit digital-to-analog converter (DAC) adapted to
receive the M-bits of data, produced by the M-bit ADC, which are indicative of the intensity of light detected by the PD during the first period of time when the light source is not driven to transmit light, and
convert the M-bits of data to a second analog signal indicative of the intensity of the light detected by the PD during the first period of time when the light source is not driven to transmit light; and
an N-bit ADC adapted to
receive a third analog signal indicative of an intensity of light detected by the PD during a further period of time with the second analog signal produced by the M-bit DAC subtracted therefrom, and
convert the third analog signal to N-bits of data, which is the digital output of the ADC with ADA feedback;
wherein during a portion of the further period of time the light source is driven to transmit light, and during another portion of the further period of time the light source is not driven to transmit light.

3. The proximity sensor of claim 2, wherein the portion of the further period of time during which the light source is driven to transmit light is shorter than the another portion of the further period of time during which the light source is not driven to transmit light.

4. The proximity sensor of claim 3, wherein the N-bit ADC includes an up-down counter that counts up during part of the further period of time at least a portion of which the light source is driven to transmit light, and counts down during a remainder of the further period of time, to thereby produce a count value, wherein the count value at the end of the further period of time is the N-bits of data indicative of a proximity of an object to the PD with at least a majority of ambient light detected by the PD rejected.

5. The proximity sensor of claim 2, wherein:
M<N.

6. The proximity sensor of claim 2, wherein:
M≧N.

7. A proximity sensor, comprising:
a driver adapted to selectively drive a light source;
a photodiode (PD);
an M-bit ADC adapted to
   receive a first analog signal indicative of an intensity of light detected by the PD during a first period of time when the light source is not driven to transmit light, and
   convert the first analog signal to M-bits of data indicative of the intensity of light detected by the PD during the first period of time when the light source is not driven to transmit light;
an M-bit digital-to-analog converter (DAC) adapted to
   receive the M-bits of data, produced by the M-bit ADC, which are indicative of the intensity of light detected by the PD during the first period of time when the light source is not driven to transmit light, and
   convert the M-bits of data to a second analog signal indicative of the intensity of the light detected by the PD during the first period of time when the light source is not driven to transmit light; and
an N-bit ADC adapted to
   receive a third analog signal indicative of an intensity of light detected by the PD during a further period of time with the second analog signal produced by the M-bit DAC subtracted therefrom, and
   convert the third analog signal to N-bits of data indicative of a proximity of an object to the PD with at least a majority of ambient light detected by the PD rejected; and
a controller that controls M-bit ADC, the M-bit DAC and the N-bit ADC;
   wherein during a portion of the further period of time the light source is driven to transmit light, and during another portion of the further period of time the light source is not driven to transmit light.

8. The proximity sensor of claim 7, wherein the controller also controls the driver.

9. The proximity sensor of claim 7, wherein the portion of the further period of time during which the light source is driven to transmit light is shorter than the another portion of the further period of time during which the light source is not driven to transmit light.

10. The proximity sensor of claim 9, wherein the N-bit ADC includes an up-down counter that counts up during part of the further period of time at least a portion of which the light source is driven to transmit light, and counts down during a remainder of the further period of time, to thereby produce a count value, wherein the count value at the end of the further period of time is the N-bits of data indicative of a proximity of an object to the PD with at least a majority of ambient light detected by the PD rejected.

11. The proximity sensor of claim 7, wherein:
M<N.

12. The proximity sensor of claim 7, wherein:
M≧N.

13. A method for use with a light source and a photodiode (PD), comprising:
(a) selectively driving the light source;
(b) producing a first analog signal indicative of an intensity of light detected by the PD during a first period of time when the light source is not driven to transmit light;
(c) converting the first analog signal to M-bits of data indicative of the intensity of light detected by the PD during the first period of time when the light source is not driven to transmit light;
(d) converting the M-bits of data to a second analog signal indicative of the intensity of the light detected by the PD during the first period of time when the light source is not driven to transmit light;
(e) producing a third analog signal indicative of an intensity of light detected by the PD during a further period of time with the second analog signal produced by the M-bit DAC subtracted therefrom; and
(f) converting the third analog signal to N-bits of data indicative of a proximity of an object to the PD with at least a majority of ambient light detected by the PD rejected;
wherein during a portion of the further period of time the light source is driven to transmit light, and during another portion of the further period of time the light source is not driven to transmit light.

14. The method of claim 13, further comprising:
(e) enabling, disabling or adjusting operation of a subsystem based on the N-bits of data produced at step (f).

15. The method of claim 13, wherein:
M<N.

16. The method of claim 13, wherein:
M≧N.

17. A system, comprising:
a driver adapted to selectively drive a light source;
a photodiode (PD) adapted to produce a photodiode current signal indicative of an intensity of light detected by the PD, where the light detected by the PD can include ambient light and/or light transmitted by the light source that was reflected off an object proximate the PD;
an analog-to-digital converter (ADC) with analog-to-digital-to-analog (ADA) feedback, wherein a digital output of the ADC with ADA feedback is indicative of a proximity of an object to the PD with at least a majority of the ambient light detected by the PD rejected;
a controller adapted to control the driver and the ADC with ADA feedback;
a subsystem capable of being enabled and disabled; and
a comparator or processor that receives digital output of the ADC with ADA feedback and enables or disables the subsystem based on the digital output of the ADC with ADA feedback;
wherein the controller and the ADC with the ADA feedback are configured to
   (a) during a first period of time when the light source is not driven to transmit light, produce M-bits of data indicative of an intensity of ambient light detected by the PD;
   (b) during a further period of time, at least a portion of which the light source is driven to transmit light,
      (b.b1) convert the M-bits of data to a first analog signal indicative of the intensity of the ambient light detected by the PD during the first period of time;
      (b.2) receive a second analog signal indicative of an intensity of light detected by the PD during the further period of time;
      (b.3) subtract the first analog signal from the second analog signal to produce a third analog signal indicative of a proximity of an object to the PD with at least a majority of the ambient light detected by the PD rejected; and (b.4) convert the third analog signal to N-bits of data, which is the digital output of the ADC with ADA feedback.

18. The system of claim 17, wherein the subsystem is selected from the group consisting of:
a touch-screen,
a display,
a backlight,
a virtual scroll wheel,
a virtual keypad, and
a navigation pad.

19. A system, comprising:
a driver adapted to selectively drive a light source;
a photodiode (PD) adapted to produce a photodiode current signal indicative of an intensity of light detected by the PD, where the light detected by the PD can include ambient light and/or light transmitted by the light source that was reflected off an object proximate the PD;
an M-bit analog-to-digital converter (ADC) adapted to
receive a first analog signal indicative of an intensity of light detected by the PD during a first period of time when the light source is not driven to transmit light, and
convert the first analog signal to M-bits of data indicative of the intensity of light detected by the PD during the first period of time when the light source is not driven to transmit light;
an M-bit digital-to-analog converter (DAC) adapted to
receive the M-bits of data, produced by the M-bit ADC, which are indicative of the intensity of light detected by the PD during the first period of time when the light source is not driven to transmit light, and
convert the M-bits of data to a second analog signal indicative of the intensity of the light detected by the PD during the first period of time when the light source is not driven to transmit light; and
an N-bit ADC adapted to
receive a third analog signal indicative of an intensity of light detected by the PD during a further period of time with the second analog signal produced by the M-bit DAC subtracted therefrom, and
convert the third analog signal to N-bits of data indicative of a proximity of an object to the PD with at least a majority of the ambient light detected by the PD rejected;
wherein during a portion of the further period of time the light source is driven to transmit light, and during another portion of the further period of time the light source is not driven to transmit light;
a subsystem capable of being enabled and disabled; and
a comparator or processor that receives N-bits of data from the N-bit ADC and enables or disables the subsystem based on the N-bits of data received from the N-bit ADC.

20. The system of claim 19, wherein the portion of the further period of time during which the light source is driven to transmit light is shorter than the another portion of the further period of time during which the light source is not driven to transmit light.

21. The system of claim 20, wherein the N-bit ADC includes an up-down counter that counts up during part of the further period of time at least a portion of which the light source is driven to transmit light, and counts down during a remainder of the further period of time, to thereby produce a count value, wherein the count value at the end of the further period of time is the N-bits of data indicative of a proximity of an object to the PD with at least a majority of ambient light detected by the PD rejected.

22. The proximity sensor of claim 1, wherein at least some components are shared by both the N-bit ADC and the M-bit ADC.

23. The proximity sensor of claim 1, wherein:
during a portion of the further period of time the light source is driven to transmit light; and
during another portion of the further period of time the light source is not driven to transmit light.

24. The system of claim 19, further comprising a controller adapted to control the driver, the M-bit ADC, the M-bit DAC and the N-bit ADC.

25. The system of claim 19, wherein:
the M-bit ADC, the M-bit DAC and the N-bit ADC are part of an analog-to-digital converter (ADC) with analog-to-digital-to-analog (ADA) feedback; and
the N-bits of data produced by the N-bit ADC is a digital output of the ADC with ADA feedback.

* * * * *

UNITED STATES PATENT AND TRADEMARK OFFICE
CERTIFICATE OF CORRECTION

| | | |
|---|---|---|
| PATENT NO. | : 8,222,591 B2 | Page 1 of 1 |
| APPLICATION NO. | : 12/716220 | |
| DATED | : July 17, 2012 | |
| INVENTOR(S) | : Xijian Lin | |

It is certified that error appears in the above-identified patent and that said Letters Patent is hereby corrected as shown below:

Column 9, Line 62, after "time" insert --;--.

Signed and Sealed this
Eighteenth Day of September, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,222,591 B2 | Page 1 of 1 |
| APPLICATION NO. | : 12/716220 | |
| DATED | : July 17, 2012 | |
| INVENTOR(S) | : X. Lin | |

It is certified that error appears in the above-identified patent and that said Letters Patent is hereby corrected as shown below:

Cover page; item [57] Abstract, line 9, change "an object proximate" to -- an object proximate to --

Column 9, line 43 (claim 1, line 8), change "the PD;" to -- to the PD; --

Column 9, line 53 (claim 1, line 18), change "configured to" to -- configured to: --

Column 10, line 14 (claim 2, line 7), change "object proximate" to -- object proximate to --

Column 12, line 38 (claim 17, line 7), change "proximate the" to -- proximate to the --

Column 12, line 52 (claim 17, line 21), change "configured to" to -- configured to: --

Column 12, line 59 (claim 17, line 28), change "(b.b 1)" to -- (b.1) --

Column 13, line 21 (claim 19, line 7), change "proximate the" to -- proximate to the --

Signed and Sealed this
Twentieth Day of November, 2012

David J. Kappos
*Director of the United States Patent and Trademark Office*